United States Patent
Polley et al.

(10) Patent No.: US 10,598,700 B2
(45) Date of Patent: Mar. 24, 2020

(54) MAGNETIC FIELD-BASED CURRENT MEASUREMENT

(71) Applicant: TEXAS INSTRUMENTS INCORPORATED, Dallas, TX (US)

(72) Inventors: Arup Polley, Richardson, TX (US); Srinath Ramaswamy, Murphy, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/395,789

(22) Filed: Dec. 30, 2016

(65) Prior Publication Data
US 2018/0188293 A1  Jul. 5, 2018

(51) Int. Cl.
*G01N 27/84* (2006.01)
*G01R 15/14* (2006.01)
*G01R 15/20* (2006.01)
*G01R 15/18* (2006.01)

(52) U.S. Cl.
CPC ......... *G01R 15/148* (2013.01); *G01R 15/185* (2013.01); *G01R 15/207* (2013.01)

(58) Field of Classification Search
CPC .. G01R 15/148; G01R 15/183; G01R 15/202; G01R 15/207; G01R 15/14; G01R 15/20; G01R 19/0092; G01R 13/02; G01R 21/08; G01R 11/32; G01R 33/18; G01R 33/02; H01L 41/12; H01L 41/16; H02K 41/06
See application file for complete search history.

(56) References Cited

U.S. PATENT DOCUMENTS

| | | | | |
|---|---|---|---|---|
| 6,940,265 B2* | 9/2005 | Hauenstein | .......... | G01R 15/207 324/117 H |
| 7,895,004 B2* | 2/2011 | Chemin | ............... | G01R 15/202 324/117 H |
| 9,081,041 B2* | 7/2015 | Friedrich | ............. | G01R 15/207 |
| 9,618,588 B2* | 4/2017 | Ausserlechner | ....... | G01R 33/09 |
| 9,678,172 B2* | 6/2017 | Ausserlechner | ...... | G01R 15/202 |
| 2002/0180417 A1* | 12/2002 | Colby | .................... | G01R 15/18 324/117 R |
| 2006/0071655 A1* | 4/2006 | Shoji | .................... | G01R 15/205 324/117 H |
| 2009/0128130 A1* | 5/2009 | Stauth | .................. | G01R 15/205 324/117 R |
| 2011/0304327 A1* | 12/2011 | Ausserlechner | ..... | G01R 15/207 324/239 |
| 2013/0265040 A1* | 10/2013 | Ide | ....................... | G01R 15/205 324/252 |

(Continued)

*Primary Examiner* — Thang X Le
(74) *Attorney, Agent, or Firm* — Michael A. Davis, Jr.; Charles A. Brill; Frank D. Cimino (57) ABSTRACT

One example includes a current measurement system. The system includes at least two magnetic field sensors positioned proximal to and in a predetermined arrangement with respect to a current conductor, each of the magnetic field sensors being configured to measure magnetic field associated with a current flowing in the current conductor and provide respective magnetic field measurements. The system also includes a current measurement processor configured to implement a mathematical algorithm based on a Taylor series expansion of the magnetic field measurements to calculate an amplitude of the current based on the mathematical algorithm.

11 Claims, 3 Drawing Sheets

(56) References Cited

U.S. PATENT DOCUMENTS

| | | | |
|---|---|---|---|
| 2013/0265041 A1* | 10/2013 | Friedrich | G01R 15/207 |
| | | | 324/260 |
| 2016/0291060 A1* | 10/2016 | Wood | G01R 1/203 |
| 2017/0059627 A1* | 3/2017 | Polley | G01R 15/185 |
| 2017/0074961 A1* | 3/2017 | Jost | G01R 33/09 |
| 2017/0089956 A1* | 3/2017 | Ausserlechner | G01R 33/09 |

* cited by examiner

MAGNETIC FIELD-BASED CURRENT MEASUREMENT

TECHNICAL FIELD

This disclosure relates generally to electronic systems, and more specifically to magnetic field-based current measurement.

BACKGROUND

In electronic circuits, electrical current can be measured for a variety of reasons. For example, current can be measured to implement circuit functions, or can be implemented for circuit protection to mitigate damage to electronic devices in an associated electronic circuit. Current can be measured in a variety of ways. One example includes measuring a voltage across a resistor in a current path of the current to be measured via Ohm's law. However, such current measurement is energy inefficient, and can add unwanted resistance to the current path. Another manner of measuring current is based on measuring a magnetic field in a non-contact manner. In a magnetic field based non-contact current sensor, current through a current conductor, such as a metal trace, creates a magnetic field that is sensed by a magnetic sensor. An intensity of the magnetic field is proportional to an amplitude of the current flowing through the current conductor.

SUMMARY

One example includes a current measurement system. The system includes at least two magnetic field sensors positioned proximal to and in a predetermined arrangement with respect to a current conductor, each of the magnetic field sensors being configured to measure magnetic field associated with a current flowing in the current conductor and provide respective magnetic field measurements. The system also includes a current measurement processor configured to implement a mathematical algorithm based on a Taylor series expansion of the magnetic field measurements to calculate an amplitude of the current based on the mathematical algorithm.

Another example includes a method for measuring an amplitude of current in a current conductor. The method includes positioning a plurality of magnetic field sensors in a predetermined arrangement proximal to the current conductor and obtaining magnetic field measurements associated with a current flowing in the current conductor via each of the plurality magnetic field sensors. The method also includes implementing a mathematical algorithm based on a Taylor series expansion of the magnetic field measurements to substantially cancel interference terms associated with an external magnetic field and calculating the amplitude of current in the current conductor based on the mathematical algorithm.

Another example includes a current measurement system. The system includes a plurality of magnetic field sensors positioned proximal to and in predetermined arrangement with respect to a plurality of current conductors, each of the plurality of magnetic field sensors being configured to measure magnetic fields associated with a plurality of currents flowing in the respective plurality of current conductors and provide magnetic fields measurements. The system also includes a current measurement processor configured to receive the magnetic field measurements and to implement a mathematical algorithm on the magnetic field measurements to calculate an amplitude of one of the plurality of currents based on the magnetic field measurements associated with each of the plurality of currents.

DETAILED DESCRIPTION

This disclosure relates generally to electronic systems, and more specifically to magnetic field-based current measurement. A current measurement system can include two or more magnetic field sensors, such as flux-gate sensors, that are arranged in a predetermined arrangement with respect to at least one current conductor (e.g., a metal trace on a printed circuit board (PCB)). As an example, the magnetic field sensors can be arranged in an equidistant and symmetric arrangement with respect to a cross-section of the current conductor(s). The magnetic field sensors are configured to measure the magnetic field associated with the current conductor(s).

The current measurement system also includes a current measurement processor that is configured to receive the magnetic field measurements associated with the current conductor(s). The current measurement processor can thus implement a mathematical calculation to compute the current amplitude in each of the current conductor(s) to mitigate interference associated with one or more other magnetic fields, such as from one or more other current conductors and/or from external magnetic field sources. As an example, the mathematical algorithm can correspond to a combination of the magnetic field measurements to cancel at least $0^{th}$ and $1^{st}$ order interference from external magnetic field sources in a Taylor series expansion of the local variation of the external magnetic field(s).

Figure 1:
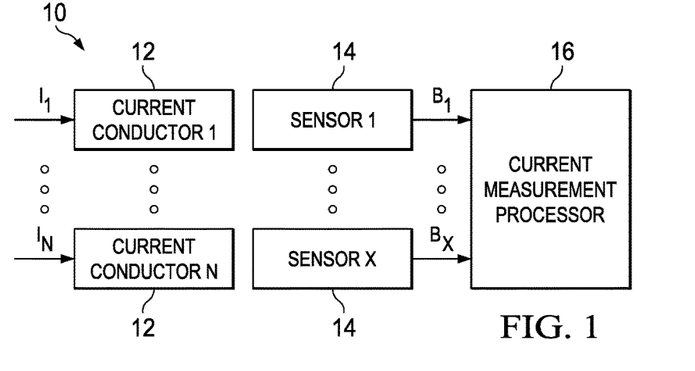
FIG. 1 illustrates an example of a current measurement system.

FIG. 1 illustrates an example of a current measurement system 10. The current measurement system 10 can be implemented in any of a variety of applications that require accurate measurement of electrical current, such as for circuit protection. The current measurement system 10 is configured to calculate an amplitude of each of at least one (N) current, demonstrated in the example of FIG. 1 as $I_1$ through $I_N$, in a respective at least one (N) current conductor 12, where N is a positive integer. As an example, each of the current conductors 12 can correspond to electrically conductive (e.g., metal) traces on a printed circuit board (PCB).

The current measurement system 10 also includes a plurality (X) of magnetic field sensors 14, where X is a positive integer greater than one. Each magnetic field sensor is configured to measure a magnetic field associated with the current conductors 12. In the example of FIG. 1, the magnetic field measurements are demonstrated as $B_1$ through $B_X$ corresponding, respectively, to the magnetic field sensors 1 through X. As an example, the magnetic field sensors 14 can be implemented as flux-gate sensors that are configured to measure a magnetic flux associated with the magnetic field generated by the respective currents $I_1$ through $I_N$ in a respective plane (e.g., parallel to the one or more current conductors 12). The magnetic field measurements $B_1$ through $B_X$ are provided to a current measurement processor 16 (e.g., via an analog-to-digital converter (ADC)) that is configured to calculate the amplitude of the currents $I_1$ through $I_N$ based on the magnetic field measurements $B_1$ through $B_X$.

As an example, the current measurement processor 16 can implement a mathematical algorithm on the magnetic field measurements $B_1$ through $B_X$ to calculate the amplitudes of the currents $I_1$ through $I_N$. For example, the mathematical algorithm can be based on implementing a Taylor series expansion of the magnetic field measurements $B_1$ through $B_X$. For example, the mathematical algorithm can correspond to obtaining a series of equations based on providing the Taylor series expansion to obtain a polynomial fit with respect to spatial coordinates of the magnetic field sensors 14 with respect to the current conductors 12 to solve for combinations of measurements in which the first term or terms corresponding to interference are canceled. By implementing the mathematical algorithm, the current measurement processor 16 can calculate the amplitude of a given one of the currents $I_1$ through $I_N$ in a manner that mitigates interference associated with magnetic fields corresponding to the other currents $I_1$ through $I_N$ and/or magnetic fields that are provided from exterior sources (e.g., spurious and/or ambient magnetic fields).

Figure 2:
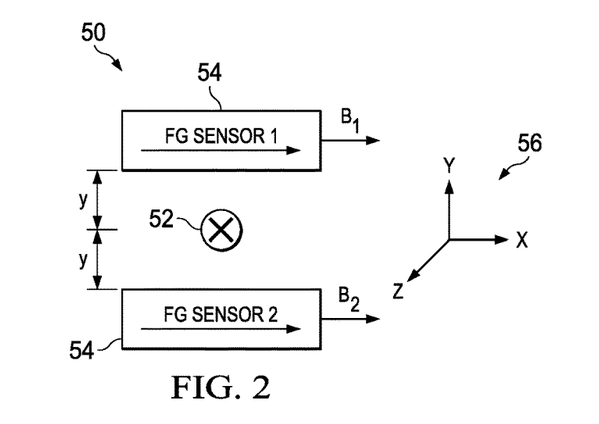
FIG. 2 illustrates a first example diagram of a current measurement.

FIG. 2 illustrates a first example diagram 50 of a current measurement. The first diagram 50 corresponds to a measurement of an amplitude of a current $I_1$ that flows in a single current conductor 52, demonstrated in a cross-section in the example of FIG. 2. The current conductor 52 can correspond to one of the current conductors 12 in the example of FIG. 1, such that the current measurement processor 16 can measure the current $I_1$ in the example of FIG. 2. Therefore, reference is to be made to the example of FIG. 1 in the following description of the example of FIG. 2.

The first diagram 50 also demonstrates a pair of flux-gate sensors 54 that are arranged in a predetermined arrangement with respect to the current conductor 52. In the example of FIG. 2, the flux-gate sensors 54, demonstrated as FG SENSOR 1 and FG SENSOR 2, are arranged equidistant from the cross-section of the current conductor 52 at a distance "y" along a Y-axis of a Cartesian coordinate system 56 in a symmetrical arrangement with respect to the cross-section of the current conductor 52. The flux-gate sensors 54 can provide magnetic field measurements $B_1$ and $B_2$ corresponding, respectively, to measured magnetic fields. In the example of FIG. 2, the flux-gate sensors 54 are demonstrated with respective arrows corresponding to the measurement polarity of the respective magnetic field measurements $B_1$ and $B_2$. The current measurement processor 16 can thus calculate the amplitude of the current $I_1$ based on the measured magnitude and direction of the magnetic fields $B_1$ and $B_2$.

As an example, the current measurement processor 16 can be configured to implement a Taylor series expansion for two variables corresponding to the magnetic field measurements $B_1$ and $B_2$. The Taylor series expansion for two variables, x and y, can be expressed, generally, as follows:

$$f(x, y) = f(a, b) + (x-a)*f_x(a, b) + \quad \text{Equation 1}$$
$$(y-b)*f_y(a, b) + \frac{1}{2!}[(x-a)^2*f_{xx}(a, b) +$$
$$2(x-a)(y-b)*f_{xy}(a, b) + (y-b)^2 f_{yy}(a, b)]$$

The Taylor series expansion can be simplified the magnetic field measurements $B_1$ and $B_2$, as follows:

$$B^{xy} = \frac{\partial}{\partial x}\frac{\partial}{\partial y}B_x(0, 0) \quad \text{Equation 2}$$

As a result, the magnetic field measurements $B_1$ and $B_2$ can be Taylor series expanded, and thus expressed as follows:

$$B_1 = B_I + B_0 + B^y \Delta y + \frac{1}{2}B^{yy}\Delta y^2 + \ldots \quad \text{Equation 3}$$

$$B_2 = -B_I + -B_0 - B^y \Delta y + \frac{1}{2}B^{yy}\Delta y^2 + \ldots \quad \text{Equation 4}$$

Where:
$B_1$ is the magnetic field component associated with the current $I_1$;
$B_0$ is a $0^{th}$ order interference component at y=0, and thus centered at the cross-section of the current conductor 52;
$B^y$ is a $1^{st}$ order interference component along the Y-axis; and
$B^{yy}$ is a $2^{nd}$ order component along the Y-axis.

The current measurement processor 16 can calculate the amplitude of the current $I_1$ based on a difference $B_{DIFF}$ of the magnetic field measurements $B_1$ and $B_2$, as follows:

$$B_{DIFF} = B_1 - B_2 \quad \text{Equation 5}$$

And substituting Equations 3 and 4 into Equation 5, $B_{DIFF}$ can be represented as follows:

$$B_{DIFF} = 2B_1 + 2B^y \Delta y + \ldots \quad \text{Equation 6}$$

The current measurement processor 16 can thus calculate the amplitude of the current $I_1$ based on the linear relationship between the net measured magnetic field $B_{DIFF}$ and the amplitude of the current $I_1$. Accordingly, by implementing a Taylor series expansion of the magnetic field measurements $B_1$ and $B_2$, the current measurement processor 16 can calculate the amplitude of the current $I_1$ in a manner that mitigates interference. Particularly, Equation 6 demonstrates that the $0^{th}$ order interference component $B_0$ is canceled in the calculation of the net measured magnetic field $B_{DIFF}$, and thus can be canceled in the calculation of the amplitude of the current $I_1$.

Figure 3:
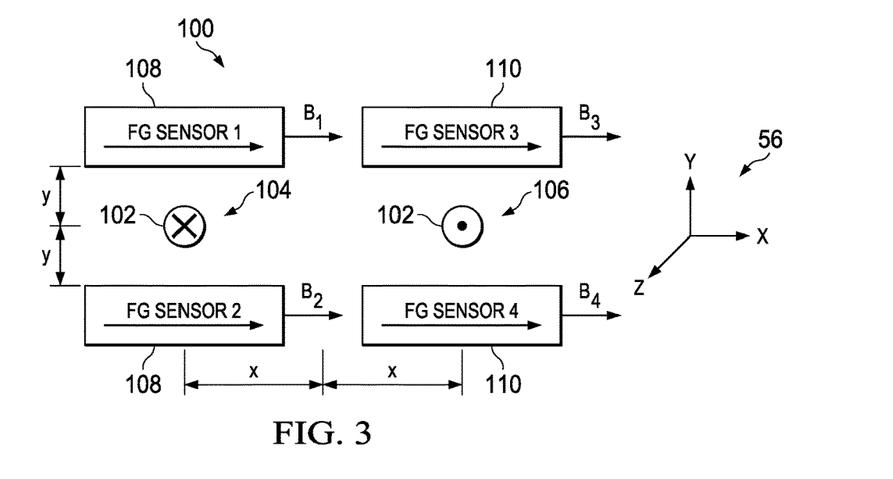
FIG. 3 illustrates a second example diagram of a current measurement.

FIG. 3 illustrates a second example diagram 100 of a current measurement. The second diagram 100 corresponds to a measurement of an amplitude of a current $I_1$ that flows in a single current conductor 102, demonstrated in two cross-sections in the example of FIG. 3. The current conductor 102 can correspond to a current conductor 12 in the example of FIG. 1, such that the current measurement processor 16 can measure the current $I_1$ in the example of FIG. 3. Therefore, reference is to be made to the example of FIG. 1 in the following description of the example of FIG. 3.

In the example of FIG. 3, the current conductor 102 is demonstrated as being arranged in a U-shape, such that the current $I_1$ flows anti-parallel with itself with respect to a first cross-section 104 of the current conductor 102 and a second cross-section 106 of the current conductor 102. Therefore, in the example of FIG. 3, the current conductor 102 is demonstrated as intersecting a cross-sectional plane at a normal angle at each of the first and second cross-sections 104 and 106. The current conductor 102 is separated at the first cross section 104 and the second cross section 106 by a distance "2x", demonstrated in the example of FIG. 3 as a distance "x" from a midpoint between the current conductor 102 in the first cross section 104 and the current conductor 102 in the second cross section 106. The second diagram 100 also demonstrates a first pair of flux-gate sensors 108 that are arranged in a predetermined arrangement with respect to the current conductor 102 at the first cross-section 104, and a second pair of flux-gate sensors 110 that are arranged in a predetermined arrangement with respect to the current conductor 102 at the second cross-section 106.

In the example of FIG. 3, each of the first pair of flux-gate sensors 108, demonstrated as FG SENSOR 1 and FG SENSOR 2, and the second pair of flux-gate sensors 110, demonstrated as FG SENSOR 3 and FG SENSOR 4, are arranged equidistant from the respective first and second cross-sections 104 and 106 of the current conductor 102 at a distance "y" along the Y-axis of the Cartesian coordinate system (e.g., similar to the Cartesian coordinate system 56 in the example of FIG. 2), and can be approximately centered about the X-axis with respect to the current conductor 102 in each of the cross-sections 104 and 106. The first pair of flux-gate sensors 108 can provide magnetic field measurements $B_1$ and $B_2$ corresponding, respectively, to measured magnetic fields, and the second pair of flux-gate sensors 110 can provide magnetic field measurements $B_3$ and $B_4$ corresponding, respectively, to measured magnetic fields. The current measurement processor 16 can thus calculate the amplitude of the current $I_1$ based on the magnetic field measurements $B_1$, $B_2$, $B_3$, and $B_4$.

Similar to as described previously in the example of FIG. 2, the current measurement processor 16 can be configured to calculate the equations that are based on the Taylor series expansion for four variables corresponding to the magnetic field measurements $B_1$, $B_2$, $B_3$, and $B_4$. As an example, the magnetic field measurements $B_1$, $B_2$, $B_3$, and $B_4$ can be Taylor series expanded, and thus expressed as follows:

$$B_I = \qquad\qquad\qquad\qquad\qquad \text{Equation 7}$$
$$B_I + B_0 - B^x \Delta x + B^y \Delta y + \frac{1}{2} B^{xx} \Delta x^2 + \frac{1}{2} B^{yy} \Delta y^2 - B^{xy} \Delta x \Delta y$$

$$B_2 = -B_I + B_0 - B^x \Delta x - \qquad\qquad \text{Equation 8}$$
$$B^y \Delta y + \frac{1}{2} B^{xx} \Delta x^2 + \frac{1}{2} B^{yy} \Delta y^2 + B^{xy} \Delta x \Delta y$$

$$B_3 = -B_I + B_0 + B^x \Delta x + \qquad\qquad \text{Equation 9}$$
$$B^y \Delta y + \frac{1}{2} B^{xx} \Delta x^2 + \frac{1}{2} B^{yy} \Delta y^2 + B^{xy} \Delta x \Delta y$$

$$B_4 = \qquad\qquad\qquad\qquad\qquad \text{Equation 10}$$
$$B_I + B_0 - B^x \Delta x - B^y \Delta y + \frac{1}{2} B^{xx} \Delta x^2 + \frac{1}{2} B^{yy} \Delta y^2 - B^{xy} \Delta x \Delta y$$

Where: $B^x$ is a $1^{st}$ order interference component along the X-axis;
$B^{XY}$ is a $2^{nd}$ order component along the X and Y-axes;
$\Delta x$ terms correspond to a distance of the interference components along the X-axis; and
$\Delta y$ terms correspond to a distance of the interference components along the Y-axis.

The current measurement processor 16 can calculate the amplitude of the current $I_1$ based on a difference $B_{DIFF}$ of combined magnetic field terms $B_{12}$ and $B_{34}$, where each of $B_{12}$ and $B_{34}$ is a difference between the magnetic fields sensed for each part of the current conductor 104 and 106. The difference $B_{DIFF}$ can be expressed as follows:

$$B_{12} = B_1 - B_2 = 2B_I + 2B^y \Delta y - 2B^{xy} \Delta x \Delta y \ldots \qquad \text{Equation 11}$$

$$B_{34} = B_3 - B_4 = -2B_I + 2B^y \Delta y + 2B^{xy} \Delta x \Delta y \ldots \qquad \text{Equation 12}$$

$$B_{DIFF} = B_{12} - B_{34} = 4B_I - 4B^{xy} \Delta x \Delta y \ldots \qquad \text{Equation 13}$$

The current measurement processor 16 can thus calculate the amplitude of the current $I_1$ based on the linear relationship between the net measured magnetic field $B_{DIFF}$ and the amplitude of the current $I_1$. Accordingly, by implementing a Taylor series expansion of the magnetic field measurements $B_1$, $B_2$, $B_3$, and $B_4$, the current measurement processor 16 can calculate the amplitude of the current $I_1$ in a manner that mitigates interference. Particularly, Equation 13 demonstrates that the 0th order interference component $B_0$ and the $1^{st}$ order interference components $B^x$ and $B^y$ are canceled in the calculation of the net measured magnetic field $B_{DIFF}$, and thus can be canceled from the calculation of the amplitude of the current $I_1$.

As further example, by implementing the Taylor series expansion of multiple variables, and thus multiple magnetic field measurements, the current measurement processor 16 can be configured to calculate the amplitudes of multiple respective currents based on a similar arrangement of magnetic field sensors 14. For example, the current measurement system 10 can include a number of pairs of magnetic field sensors 14 equal to 2*N+2, and thus the number of current conductors 12 plus one, to facilitate calculation of the amplitudes of the respective currents $I_1$ through $I_N$, such as demonstrated in the examples of FIGS. 4 and 5.

Figure 4:
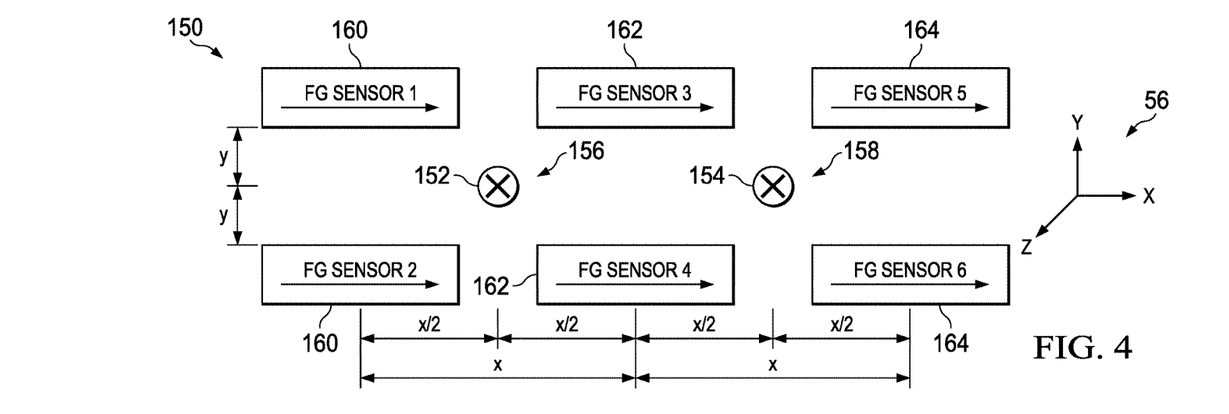
FIG. 4 illustrates a third example diagram of a current measurement.

FIG. 4 illustrates a third example diagram 150 of a current measurement. The third diagram 150 corresponds to a measurement of an amplitude of a first current $I_1$ that flows in a first current conductor 152 and a second current $I_2$ that flows in a second current conductor 154, demonstrated in two respective cross-sections in the example of FIG. 4. The current conductors 152 and 154 can correspond to two of the current conductors 12 in the example of FIG. 1, such that the current measurement processor 16 can measure the amplitude of currents $I_1$ and $I_2$ in the example of FIG. 4. Therefore, reference is to be made to the example of FIG. 1 in the following description of the example of FIG. 4.

In the example of FIG. 4, the current conductors 152 and 154 are demonstrated as each intersecting a cross-sectional plane at a normal angle at each of a first cross-section 156 and a second cross-section 158, respectively. The first current conductor 152 and the second current conductor 154 are separated by a distance "x" along the X-axis of the coordinate system. The third diagram 150 also demonstrates a first pair of flux-gate sensors 160, demonstrated as FG SENSOR 1 and FG SENSOR 2, a second pair of flux-gate sensors 162, demonstrated as FG SENSOR 3 and FG SENSOR 4, and a third pair of flux-gate sensors 164, demonstrated as FG SENSOR 5 and FG SENSOR 6.

The pairs of flux-gate sensors 160, 162, and 164 are arranged in a predetermined arrangement with respect to the current conductors 152 and 154. In this example, the pairs of flux-gate sensors 160, 162, and 164 are arranged equidistant from the respective first and second cross-sections 154 and 156 of the current conductor 152 at a distance "y" along the Y-axis of the Cartesian coordinate system (e.g., similar to the Cartesian coordinate system 56 in the example of FIG. 2). Additionally, the pairs of flux-gate sensors 160, 162, and 164 are arranged symmetric with respect to the X-axis of the Cartesian coordinate system through the cross-sections 156 and 158, and are each a distance "x/2" from a midpoint of at least one of the respective current conductors 152 and 154, with the second pair of flux-gate sensors 162 being a distance "x/2" from both of the current conductors 152 and 154.

The first pair of flux-gate sensors 160 can provide magnetic field measurements $B_1$ and $B_2$ corresponding, respectively, to measured magnetic fields. The second pair of flux-gate sensors 162 can provide magnetic field measurements $B_3$ and $B_4$ corresponding, respectively, to measured magnetic fields. The third pair of flux-gate sensors 164 can provide magnetic field measurements $B_5$ and $B_6$ corresponding, respectively, to measured magnetic fields. The current measurement processor 16 can thus calculate the amplitude of the currents $I_1$ and $I_2$ individually based on the magnetic field measurements $B_1$, $B_2$, $B_3$, $B_4$, $B_5$, $B_6$.

Similar to as described previously in the example of FIG. 2, the current measurement processor 16 can be configured to implement a Taylor series expansion for six variables corresponding to the magnetic field measurements $B_1$, $B_2$, $B_3$, $B_4$, $B_5$, $B_6$. As an example, the magnetic field measurements $B_1$, $B_2$, $B_3$, $B_4$, $B_5$, $B_6$ can be expanded, and thus expressed as follows:

$$B_1 = B_{I11} + B_{I12} + B_{ext1} \quad \text{Equation 14}$$

$$B_2 = -B_{I11} - B_{I12} + B_{ext2} \quad \text{Equation 15}$$

$$B_3 = B_{I21} + B_{I22} + B_{ext3} \quad \text{Equation 16}$$

$$B_4 = -B_{I21} - B_{I22} + B_{ext4} \quad \text{Equation 17}$$

$$B_5 = B_{I31} + B_{I32} + B_{ext5} \quad \text{Equation 18}$$

$$B_6 = -B_{I31} - B_{I32} + B_{ext6} \quad \text{Equation 19}$$

Where: $B_{I11}$ is a magnetic field associated with the first current $I_1$ as measured by each of the flux-gate sensors 160;

$B_{I12}$ is a magnetic field associated with the second current $I_2$ as measured by each of the flux-gate sensors 160;

$B_{I21}$ is a magnetic field associated with the first current $I_1$ as measured by each of the flux-gate sensors 162;

$B_{I22}$ is a magnetic field associated with the second current $I_2$ as measured by each of the flux-gate sensors 162;

$B_{I31}$ is a magnetic field associated with the first current $I_1$ as measured by each of the flux-gate sensors 164;

$B_{I32}$ is a magnetic field associated with the second current $I_2$ as measured by each of the flux-gate sensors 164;

$B_{ext1}$ is a magnetic field component associated with interference (e.g., $0^{th}$ order, $1^{st}$ order, etc.) as measured by the first of the flux-gate sensors 160;

$B_{ext2}$ is a magnetic field component associated with interference (e.g., $0^{th}$ order, $1^{st}$ order, etc.) as measured by the second of the flux-gate sensors 160;

$B_{ext3}$ is a magnetic field component associated with interference (e.g., $0^{th}$ order, $1^{st}$ order, etc.) as measured by the first of the flux-gate sensors 162;

$B_{ext4}$ is a magnetic field component associated with interference (e.g., $0^{th}$ order, $1^{st}$ order, etc.) as measured by the second of the flux-gate sensors 162;

$B_{ext5}$ is a magnetic field component associated with interference (e.g., $0^{th}$ order, $1^{st}$ order, etc.) as measured by the first of the flux-gate sensors 164; and $B_{ext6}$ is a magnetic field component associated with interference (e.g., $0^{th}$ order, $1^{st}$ order, etc.) as measured by the second of the flux-gate sensors 164.

Based on the symmetrical placement of the pairs of flux-gate sensors 160, 162, and 164, the magnetic field terms $B_{I11}$, $B_{I21}$, and $B_{I32}$ can be expressed as:

$$B_{I11} = aI_1, \; B_{I12} = bI_2 \quad \text{Equation 20}$$

$$B_{I21} = aI_1, \; B_{I22} = aI_2 \quad \text{Equation 21}$$

$$B_{I32} = aI_2, \; B_{I31} = bI_1 \quad \text{Equation 22}$$

Where: a, b are predetermined constants.

The current measurement processor 16 can calculate the amplitude of the current $I_2$ based on a difference $B_{DIFF1}$ of a combination of magnetic field terms $B_1$, $B_2$, $B_3$, and $B_4$, as follows:

$$B_{DIFF1} = (B_1 - (B_2)) - (B_3 - B_4) \quad \text{Equation 23}$$

$$B_{DIFF1} = 2B_{I11} + 2B_{I12} - 2B_{I21} - 2B_{I21} - B_{ext}^{xy} \Delta x \Delta y + \ldots \quad \text{Equation 24}$$

$$B_{DIFF1} = 2aI_1 + 2bI_2 - 2aI_1 - 2aI_2 - B_{ext}^{xy} \Delta x \Delta y + \ldots \quad \text{Equation 25}$$

$$B_{DIFF1} = (2b - 2a)I_2 - B_{ext}^{xy} \Delta x \Delta y + \ldots \quad \text{Equation 26}$$

The current measurement processor 16 can also calculate the amplitude of the current $I_1$ based on a difference $B_{DIFF2}$ of a combination of magnetic field terms $B_3$, $B_4$, $B_5$, and $B_6$, as follows:

$$B_{DIFF2} = (B_3 - B_4) - (B_5 - B_6) \quad \text{Equation 27}$$

$$B_{DIFF2} = 2B_{I21} 2B_{I22} - 2B_{I31} - 2B_{I32} - B_{ext}^{xy} \Delta x \Delta y + \ldots \quad \text{Equation 28}$$

$$B_{DIFF2} = 2aI_1 + 2aI_2 - 2bI_1 - 2aI_2 - B_{ext}^{xy} \Delta x \Delta y + \ldots \quad \text{Equation 29}$$

$$B_{DIFF2} = (2a - 2b)I_1 - B_{ext}^{xy} \Delta x \Delta y + \ldots \quad \text{Equation 30}$$

Since the constants a and b are known, the current measurement processor 16 can thus calculate the amplitude of the currents $I_1$ and $I_2$ based on the linear relationship between the net measured magnetic fields $B_{DIFF1}$ and $B_{DIFF2}$ and the amplitudes of the currents $I_1$ and $I_2$, respectively. Accordingly, by implementing a Taylor series expansion of the magnetic field measurements $B_1$, $B_2$, $B_3$, $B_4$, $B_5$, and $B_6$, the current measurement processor 16 can calculate the amplitude of the currents $I_1$ and $I_2$ in a manner that mitigates interference. Particularly, Equations 26 and 30 demonstrate that the $0^{th}$ order and $1^{st}$ order interference components B0, and $B^x$ and $B^y$, respectively, are canceled in the calculation of the net measured magnetic fields BDIFF1 and $B_{DIFF2}$, and thus can be canceled in the calculation of the amplitude of the currents $I_1$ and $I_2$.

Figure 5:
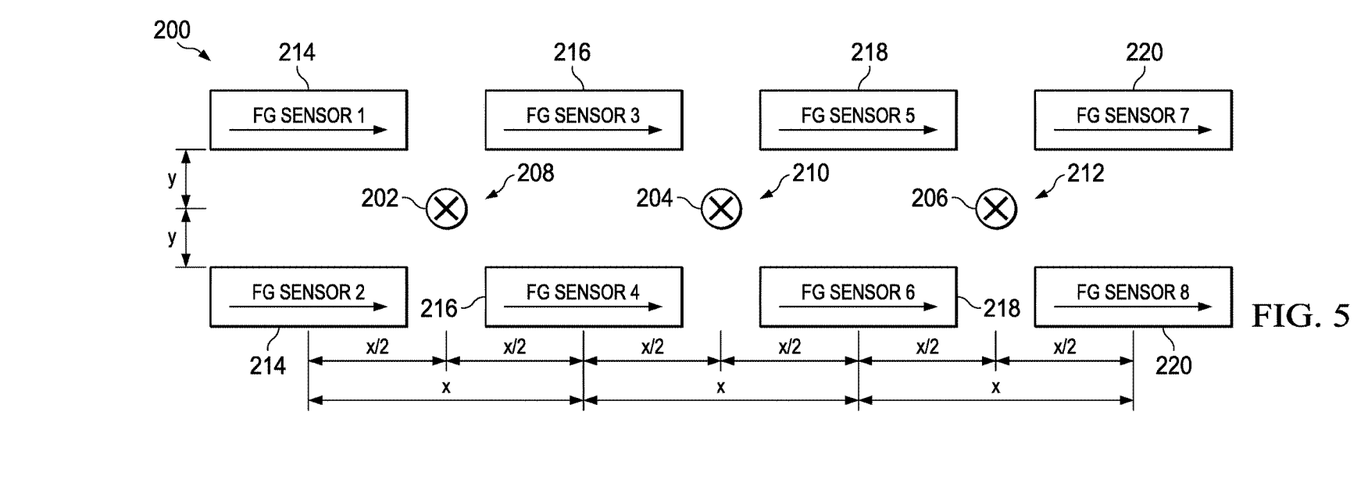
FIG. 5 illustrates a fourth example diagram of a current measurement.

FIG. 5 illustrates a fourth example diagram 200 of a current measurement. The fourth diagram 200 corresponds to a measurement of an amplitude of a first current $I_1$ that flows in a first current conductor 202, a second current $I_2$ that flows in a second current conductor 204, and a third current $I_3$ that flows in a third current conductor 206, demonstrated in three respective cross-sections in the example of FIG. 5. The current conductors 202, 204, and 206 can correspond to three of the current conductors 12 in the example of FIG. 1, such that the current measurement processor 16 can measure the amplitude of currents $I_1$, $I_2$, and $I_3$ in the example of FIG. 5. Therefore, reference is to be made to the example of FIG. 1 in the following description of the example of FIG. 5.

In the example of FIG. 5, the current conductors 202, 204, and 206 are demonstrated as each intersecting a cross-sectional plane at a normal angle at each of a first cross-section 208, a second cross-section 210, and a third cross-section 212, respectively. The current conductors 202, 204, and 206 are each separated from a next one of the current conductors 202, 204, and 206 by a distance "x". The fourth diagram 200 also demonstrates a first pair of flux-gate sensors 214, demonstrated as FG SENSOR 1 and FG SENSOR 2, a second pair of flux-gate sensors 216, demonstrated as FG SENSOR 3 and FG SENSOR 4, a third pair of flux-gate sensors 218, demonstrated as FG SENSOR 5 and FG SENSOR 6, and a fourth pair of flux-gate sensors 220, demonstrated as FG SENSOR 7 and FG SENSOR 8.

The pairs of flux-gate sensors 214, 216, 218, and 220 are arranged in a predetermined arrangement with respect to the current conductors 202, 204, and 206. Particularly, the pairs of flux-gate sensors 214, 216, 218, and 220 are arranged equidistant from the respective cross-sections 208, 210, and 212 of the current conductor 202 at a distance "y" along the Y-axis of the Cartesian coordinate system (e.g., similar to the Cartesian coordinate system 56 in the example of FIG. 2). Additionally, the pairs of flux-gate sensors 214, 216, 218, and 220 are arranged symmetric with respect to an axis through the cross-sections 208, 210, and 212, and are each a distance "x/2" along the X-axis from a midpoint of at least one of the respective current conductors 202, 204, and 206, with the second pair of flux-gate sensors 216 being a distance "x/2" from both of the current conductors 202 and 204 and the third pair of flux-gate sensors 218 being a distance "x/2" from both of the current conductors 204 and 206.

The first pair of flux-gate sensors 214 can provide magnetic field measurements $B_1$ and $B_2$ corresponding, respectively, to measured magnetic fields. The second pair of flux-gate sensors 216 can provide magnetic field measurements $B_3$ and $B_4$ corresponding, respectively, to measured magnetic fields. The third pair of flux-gate sensors 218 can provide magnetic field measurements $B_5$ and $B_6$ corresponding, respectively, to measured magnetic fields. The fourth pair of flux-gate sensors 220 can provide magnetic field measurements $B_7$ and $B_8$ corresponding, respectively, to measured magnetic fields. The current measurement processor 16 can thus calculate the amplitude of the currents $I_1$, $I_2$, and $I_3$ individually based on the magnetic field measurements $B_1$, $B_2$, $B_3$, $B_4$, $B_5$, $B_6$, $B_7$, and $B_8$.

Similar to as described previously in the example of FIG. 2, the current measurement processor 16 can be configured to implement a Taylor series expansion for eight variables corresponding to the magnetic field measurements $B_1$, $B_2$, $B_3$, $B_4$, $B_5$, $B_6$, $B_7$, and $B_8$. As an example, the magnetic field measurements $B_1$, $B_2$, $B_3$, $B_4$, $B_5$, $B_6$, $B_7$, and $B_8$ can be Taylor series expanded, and thus expressed as follows:

$$B_1 = B_{I11} + B_{I12} + B_{I13} + B_{ext1} \quad \text{Equation 31}$$

$$B_2 = -B_{I11} - B_{I12} - B_{I13} + B_{ext2} \quad \text{Equation 32}$$

$$B_3 = B_{I21} + B_{I22} + B_{I23} + B_{ext3} \quad \text{Equation 33}$$

$$B_4 = -B_{I21} - B_{I22} - B_{I23} + B_{ext4} \quad \text{Equation 34}$$

$$B_5 = B_{I31} + B_{I32} + B_{I33} + B_{ext5} \quad \text{Equation 35}$$

$$B_6 = -B_{I31} - B_{I32} - B_{I33} + B_{ext6} \quad \text{Equation 36}$$

$$B_7 = B_{I41} + B_{I42} + B_{I43} + B_{ext7} \quad \text{Equation 37}$$

$$B_8 = -B_{I41} - B_{I42} - B_{I43} + B_{ext8} \quad \text{Equation 38}$$

Where: $B_{I13}$ is a magnetic field associated with the third current $I_3$ as measured by each of the flux-gate sensors 214;

$B_{I23}$ is a magnetic field associated with the third current $I_3$ as measured by each of the flux-gate sensors 216;

$B_{I33}$ is a magnetic field associated with the third current $I_3$ as measured by each of the flux-gate sensors 218;

$B_{I23}$ is a magnetic field associated with the third current $I_3$ as measured by each of the flux-gate sensors 220;

$B_{I41}$ is a magnetic field associated with the first current $I_1$ as measured by each of the flux-gate sensors 220;

$B_{I42}$ is a magnetic field associated with the second current $I_2$ as measured by each of the flux-gate sensors 220;

$B_{I43}$ is a magnetic field associated with the third current $I_3$ as measured by each of the flux-gate sensors 220;

$B_{ext7}$ is a magnetic field component associated with interference (e.g., $0^{th}$ order, $1^{st}$ order, etc.) as measured by the first of the flux-gate sensors 220; and $B_{ext8}$ is a magnetic field component associated with interference (e.g., $0^{th}$ order, $1^{st}$ order, etc.) as measured by the second of the flux-gate sensors 220.

Based on the symmetrical placement of the pairs of flux-gate sensors 210, 212, and 214, the magnetic field terms $B_{I11}$, $B_{I21}$, and $B_{I32}$ can be expressed as:

$$B_{I11} = aI_1, \ B_{I12} = bI_2, \ B_{I12} = cI_3 \quad \text{Equation 39}$$

$$B_{I21} = B_{I23} = bI_2, \ B_{I22} = aI_2 \quad \text{Equation 40}$$

$$B_{I31} = bI_1, \ B_{I32} = B_{I33} = aI_2 \quad \text{Equation 41}$$

$$B_{I41} = cI_1, \ B_{I42} = bI_2, \ B_{I43} = aI_3 \quad \text{Equation 43}$$

Where: a, b, c are constants.

The current measurement processor 16 can calculate the amplitude of the current $I_1$ based on a difference $B_{DIFF1}$ of a combination of magnetic field terms $B_1$, $B_2$, $B_3$, and $B_4$, as follows:

$$B_{DIFF1} = (B_1 - B_2) - (B_3 - B_4) \quad \text{Equation 44}$$

$$B_{DIFF1} = 2aI_1 + 2bI_2 + 2cI_3 - 2aI_1 - 2aI_2 - 2bI_3 - B_{ext}^{xy} \Delta x \Delta y + \ldots \quad \text{Equation 45}$$

$$B_{DIFF1} = (2b - 2a)I_2 + (2c - 2b)I_2 - B_{ext}^{xy} \Delta x \Delta y + \ldots \quad \text{Equation 46}$$

The current measurement processor 16 can also calculate the amplitude of the current $I_2$ based on a difference $B_{DIFF2}$ of a combination of magnetic field terms $B_3$, $B_4$, $B_5$, and $B_6$, as follows:

$$B_{DIFF2} = (B_3 - B_4) - (B_5 - B_6) \quad \text{Equation 47}$$

$$B_{DIFF2} = 2aI_1 + 2aI_2 + 2bI_3 - 2bI_1 - 2aI_2 - 2aI_3 - B_{ext}^{xy} \Delta x \Delta y + \ldots \quad \text{Equation 48}$$

$$B_{DIFF2} = (2a - 2b)I_1 + (2b - 2a)I_3 - B_{ext}^{xy} \Delta x \Delta y + \ldots \quad \text{Equation 49}$$

The current measurement processor 16 can also calculate the amplitude of the current $I_3$ based on a difference $B_{DIFF3}$ of a combination of magnetic field terms $B_5$, $B_6$, $B_7$, and $B_8$, as follows:

$$B_{DIFF3} = (B_5 - B_6) - (B_7 - B_8) \quad \text{Equation 50}$$

$$B_{DIFF3} = 2bI_1 + 2aI_2 + 2aI_3 - 2cI_1 - 2bI_2 - 2aI_3 - B_{ext}^{xy} \Delta x \Delta y + \ldots \quad \text{Equation 51}$$

$$B_{DIFF3} = (2b - 2c)I_1 + (2a - 2b)I_2 - B_{ext}^{xy} \Delta x \Delta y + \ldots \quad \text{Equation 52}$$

The current measurement processor 16 can thus calculate the amplitude of the currents $I_1$, $I_2$, and $I_3$ based on the linear relationship between the net measured magnetic fields $B_{DIFF1}$, $B_{DIFF2}$, and $B_{DIFF3}$ and the amplitudes of the currents $I_1$, $I_2$, and $I_3$, respectively. Accordingly, by implementing a Taylor series expansion of the magnetic field measurements $B_1$, $B_2$, $B_3$, $B_4$, $B_5$, $B_6$, $B_7$, and $B_8$, the current measurement processor 16 can calculate the amplitude of the currents $I_1$, $I_2$, and $I_3$ in a manner that mitigates interference. Particularly, Equations 46, 49, and 52 demonstrate that the $0^{th}$ order and $1^{st}$ order interference components B0, and $B^x$ and $B^y$, respectively, are canceled in the calculation of the net measured magnetic fields $B_{DIFF1}$, $B_{DIFF2}$, and $B_{DIFF3}$, and thus can be canceled in the calculation of the amplitude of the currents $I_1$, $I_2$, and $I_3$.

As demonstrated in the examples of FIGS. 4 and 5, the current measurement system 10 can be expanded to measure multiple currents based on the addition of additional pairs of flux-gate sensors. Therefore, the current measurement system 10 can implement 2*N+2 flux-gate sensors (i.e., N+1 flux-gate sensor pairs), where N is the number of current conductors 12. Accordingly, the current measurement system 10 can be scaled to measure the current in any number of current conductors in a manner that mitigates the effects of up to $2^{nd}$ order magnetic interference.

Figure 6:
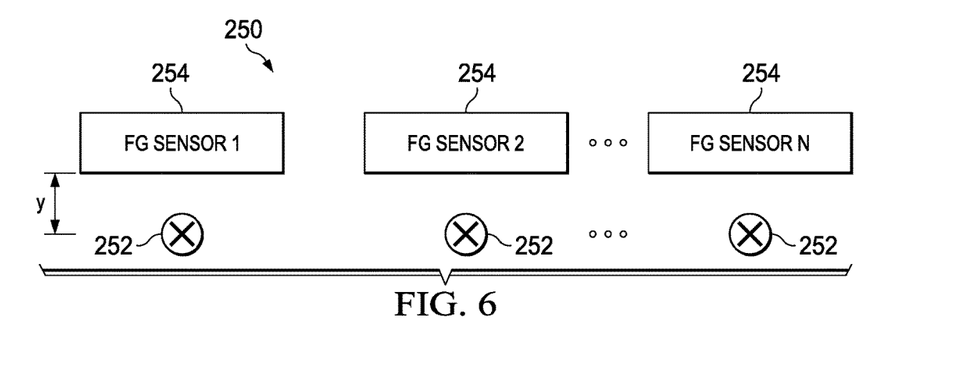
FIG. 6 illustrates a fifth example diagram of a current measurement.

FIG. 6 illustrates a fifth example diagram 250 of a current measurement. The fifth diagram 250 corresponds to a measurement of an amplitude of a plurality N of AC currents that flow in a plurality of AC current conductors 252. The current conductors 252 can correspond to the current conductors 12 in the example of FIG. 1, such that the current measurement processor 16 can measure the amplitude of currents $I_1$ through $I_N$ in the example of FIG. 6. Therefore, reference is to be made to the example of FIG. 1 in the following description of the example of FIG. 6.

In the example of FIG. 6, the current conductors 252 are demonstrated as each intersecting a cross-sectional plane at a normal angle at each of a respective plurality of cross-sections. The fifth diagram 250 also demonstrates a respective plurality of flux-gate sensors 254, demonstrated as FG SENSOR 1 through FG SENSOR N. The flux-gate sensors 254 are arranged in a predetermined arrangement with respect to the current conductors 252, such as being offset by a predetermined distance (e.g., a distance "y" along the Y-axis of the Cartesian coordinate system) and aligned with a mid-point of the sensor along the X-axis. The flux-gate sensors 254 can provide magnetic field measurements $B_1$ through $B_N$ corresponding, respectively, to measured magnetic fields associated with the current conductors 252. The current measurement processor 16 can thus calculate the amplitude of the currents $I_1$ through $I_N$ individually based on the magnetic field measurements $B_1$ through $B_N$, respectively.

As an example, the current measurement processor 16 can provide a set of equations with a respective set of unknowns, similar to as described previously. For example, the current measurement processor 16 can provide a set of equations as follows:

$$S_i = \sum_{j=1}^{n} a_{ij} I_j + n_i \qquad \text{Equation 53}$$

Where: $S_i$ corresponds to an output of the $i^{th}$ flux-gate sensor 254;
  $a_{ij}$ corresponds to a predetermined coupling coefficient from a $j^{th}$ current conductor 252 to the $i^{th}$ sensor based on positional geometry;
  $I_j$ corresponds to an amplitude of the current through the $j^{th}$ current conductor 252; and
  $n_j$ corresponds to noise and interference measured by the $i^{th}$ flux-gate sensor 254.

Therefore, the current measurement processor 16 can be configured to solve the n coupled linear equations based on n unknowns. Accordingly, the current measurement system 10 can be configured to measure any number of AC currents in any number of current conductors 12 in a manner that mitigates the effects of up to magnetic interference, similar to as described previously.

Accordingly, as described herein, the current measurement system 10 can measure one or more current amplitudes in a respective one or more current conductors 12 that carry AC or DC currents. Based on the predetermined position of the magnetic field sensors 14 relative to the current conductors 12, the current measurement processor 16 can calculate the current amplitudes based on a Taylor series expansion to substantially mitigate interference in the magnetic field measurements. Accordingly, the current measurement system 10 can calculate current amplitudes in a contact-less manner while substantially mitigating interference measured by the respective magnetic field sensors 14. Alternatively, the systems and methods described herein can likewise be applicable to position measurement associated with positions of independent magnets (e.g., magnetic field sources) based on a similar arrangement and calculation methodology.

Figure 7:
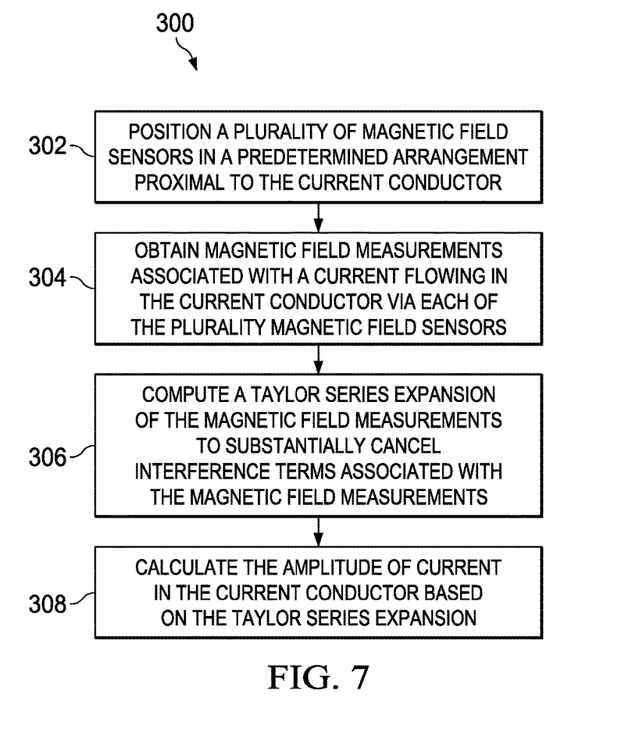
FIG. 7 illustrates an example of a method for measuring an amplitude of current in a current conductor.

In view of the foregoing structural and functional features described above, a method in accordance with various aspects of the present disclosure will be better appreciated with reference to FIG. 7. While, for purposes of simplicity of explanation, the method of FIG. 7 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure.

FIG. 7 illustrates an example of a method 300 for measuring an amplitude of current in a current conductor (e.g., one of the current conductors 12). At 302, a plurality of magnetic field sensors (e.g., the magnetic field sensors 14) are positioned in a predetermined fixed arrangement proximal to the current conductor. At 304, magnetic field measurements associated with a current flowing in the current conductor are obtained via each of the plurality magnetic field sensors. At 306, a Taylor series expansion of the magnetic field measurements is computed (e.g., via the magnetic field processor 16) to substantially cancel interference terms associated with the magnetic field measurements. At 308, the amplitude of current in the current conductor is calculated based on the Taylor series expansion. As an example, the method 300 can be applicable to calculation of DC currents, such as demonstrated in the examples of FIGS. 2-5, or to calculation of AC currents, such as demonstrated in the example of FIG. 6.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A system, comprising:
a first set of magnetic field sensors having a first output, the first set of magnetic field sensors positioned and configured to generate a first magnetic field measurement representative of a first current through a first conductor and to provide the first magnetic field measurement at the first output;
a second set of magnetic field sensors having a second output, the second set of magnetic field sensors positioned and configured to generate a second magnetic field measurement representative of the first current through the first conductor, and to generate a third magnetic field measurement representative of a second current through a second conductor, and to provide the second magnetic field measurement and the third magnetic field measurement at the second output;
a third set of magnetic field sensors having a third output, the third set of magnetic field sensors positioned and configured to generate a fourth magnetic field measurement representative of the second current through the second conductor and to provide the fourth magnetic field measurement at the third output; and
a current measurement processor coupled to the first output, the second output and the third output, the current measurement processor configured to calculate an amplitude of the first current based on a Taylor series expansion of the first magnetic field measurement and the second magnetic field measurement.

2. The system of claim 1, wherein the current measurement processor is configured to calculate the amplitude of the first current and an amplitude of the second current based on:
a Taylor series expansion of the first, second, third and fourth magnetic field measurements to mitigate interference terms associated with an external magnetic field; and
spatial coordinates of the first set of magnetic field sensors, the second set of magnetic field sensors, and the third set of magnetic field sensors.

3. The system of claim 1, wherein the first set of magnetic field sensors includes a pair of magnetic field sensors positioned in an equidistant and symmetrical arrangement with respect to an axis intersecting a cross section of the first conductor.

4. The system of claim 1, wherein the first set of magnetic field sensors includes a pair of magnetic field sensors configured as a pair of fluxgate sensors.

5. The system of claim 3, wherein the pair is a first pair, and:
the second set of magnetic field sensors includes a second pair of magnetic field sensors positioned in an equidistant and symmetrical arrangement with respect to an axis intersecting a cross section of the first conductor and the second conductor; and
the third set of magnetic field sensors includes a third pair of magnetic field sensors positioned in an equidistant and symmetrical arrangement with respect to an axis intersecting a cross section of the second conductor.

6. The system of claim 1, wherein the first conductor and the second conductor are arranged for alternating current ("AC") to flow through the first conductor and the second conductor.

7. The system of claim 1, wherein the first magnetic field measurement is representative of the first current at a cross section of the first conductor, and the second magnetic field measurement is representative of the first current at the cross section of the first conductor.

8. A method, comprising:
positioning a first set of magnetic field sensors relative to a first conductor;
positioning a second set of magnetic field sensors relative to the first conductor and a second conductor, the first conductor being arranged to conduct a first current in a first direction through the first conductor, and the second conductor being arranged to conduct a second current in a second direction through the second conductor;
positioning a third set of magnetic field sensors relative to the second conductor;
from the first set of magnetic field sensors, obtaining a first magnetic field measurement representative of the first current through the first conductor;
from the second set of magnetic field sensors, obtaining a second magnetic field measurement representative of the first current through the first conductor, and obtaining a third magnetic field measurement representative of the second current through the second conductor;
from the third set of magnetic field sensors, obtaining a fourth magnetic field measurement representative of the second current through the second conductor; and
calculating an amplitude of the first current based on a Taylor series expansion of the first magnetic field measurement and the second magnetic field measurement to mitigate interference terms associated with an external magnetic field.

9. The method of claim 8, wherein positioning the first set of magnetic field sensors comprises positioning a pair of magnetic field sensors in an equidistant and symmetrical arrangement with respect to an axis intersecting a cross section of the first conductor.

10. The method of claim 9, wherein the pair is a first pair, and:
positioning the second set of magnetic field sensors comprises positioning a second pair of magnetic field sensors in an equidistant and symmetrical arrangement with respect to an axis intersecting a cross section of the first conductor and the second conductor; and
positioning the third set of magnetic field sensors comprises positioning a third pair of magnetic field sensors in an equidistant and symmetrical arrangement with respect to an axis intersecting a cross section of the second conductor.

11. The method of claim 8, wherein the first conductor and the second conductor are arranged for alternating current ("AC") to flow through the first conductor and the second conductor.

* * * * *